United States Patent
Izumi et al.

(10) Patent No.: US 10,593,603 B2
(45) Date of Patent: Mar. 17, 2020

(54) CHEMICAL MECHANICAL POLISHING APPARATUS CONTAINING HYDRAULIC MULTI-CHAMBER BLADDER AND METHOD OF USING THEREOF

(71) Applicant: SANDISK TECHNOLOGIES LLC, Plano, TX (US)

(72) Inventors: Keisuke Izumi, Yokkaichi (JP); Naomi Matsuda, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/923,516

(22) Filed: Mar. 16, 2018

(65) Prior Publication Data

US 2019/0287866 A1    Sep. 19, 2019

(51) Int. Cl.
| | | |
|---|---|---|
| *H01L 21/66* | (2006.01) | |
| *B24B 37/015* | (2012.01) | |
| *H01L 21/321* | (2006.01) | |
| *B24B 37/04* | (2012.01) | |
| *H01L 21/768* | (2006.01) | |

(52) U.S. Cl.
CPC ............ *H01L 22/26* (2013.01); *B24B 37/015* (2013.01); *B24B 37/042* (2013.01); *H01L 21/3212* (2013.01); *H01L 21/7684* (2013.01)

(58) Field of Classification Search
CPC ....... B24B 37/042; B24B 37/20; B24B 37/30; B24B 41/002; B24B 49/14; G01R 31/2886; G01R 31/2887; G01R 31/2889; H01L 21/30625
See application file for complete search history.

(56) References Cited

U.S. PATENT DOCUMENTS

| | | | |
|---|---|---|---|
| 6,905,398 B2 | 6/2005 | Jeong | |
| 7,004,814 B2 | 2/2006 | Chen et al. | |
| 7,156,720 B2 * | 1/2007 | Saito | ...................... B24B 37/30 |
| | | | 451/11 |
| 10,065,288 B2 * | 9/2018 | Wu | ........................ B24B 49/04 |
| 2001/0013503 A1 | 8/2001 | Custer et al. | |
| 2001/0044269 A1 | 11/2001 | Carpenter | |
| 2002/0061716 A1 | 5/2002 | Korovin et al. | |
| 2002/0142704 A1 | 10/2002 | Hu et al. | |
| 2002/0151260 A1 | 10/2002 | Crevasse et al. | |
| 2002/0173230 A1 | 11/2002 | Mayes | |
| 2002/0187640 A1 | 12/2002 | Wake | |
| 2002/0197938 A1 | 12/2002 | Mayes | |
| 2003/0027500 A1 | 2/2003 | James et al. | |
| 2003/0143937 A1 | 7/2003 | Peng et al. | |
| 2003/0166339 A1 | 9/2003 | Thomas et al. | |
| 2003/0189060 A1 | 10/2003 | Osterheld et al. | |
| 2003/0216115 A1 | 11/2003 | Custer et al. | |
| 2004/0036201 A1 | 2/2004 | Chou et al. | |

(Continued)

FOREIGN PATENT DOCUMENTS

JP    2005268566 A    9/2005

*Primary Examiner* — Edward Chin
(74) *Attorney, Agent, or Firm* — The Marbury Law Group, PLLC

(57) ABSTRACT

A chemical mechanical polishing apparatus includes a liquid filled bladder that exerts force on the back of the substrate being polished. The bladder can be a multi-chamber bladder having chambers filled with different ratios of hot and cold water. Eddy current detection during the polishing can be used to control the polishing process parameters.

16 Claims, 3 Drawing Sheets

(56) References Cited

U.S. PATENT DOCUMENTS

| | | |
|---|---|---|
| 2004/0045578 A1 | 3/2004 | Jackson |
| 2004/0192177 A1 | 9/2004 | Carpenter |
| 2004/0221799 A1 | 11/2004 | Nakayama et al. |
| 2005/0020082 A1 | 1/2005 | Vishwanathan et al. |
| 2005/0042875 A1 | 2/2005 | Custer et al. |
| 2005/0054272 A1* | 3/2005 | Takahashi ............ B24B 37/042 451/41 |
| 2005/0133156 A1 | 6/2005 | Kim |
| 2005/0145879 A1 | 7/2005 | Nakayama et al. |
| 2005/0189001 A1 | 9/2005 | Lin |
| 2005/0260931 A1 | 11/2005 | Custer et al. |
| 2005/0266778 A1 | 12/2005 | Custer et al. |
| 2007/0205214 A1 | 9/2007 | Roberts |
| 2007/0298692 A1 | 12/2007 | Mavliev et al. |
| 2008/0106003 A1 | 5/2008 | Chou |
| 2008/0200099 A1* | 8/2008 | Brown ................. B24B 37/042 451/41 |
| 2009/0186560 A1 | 7/2009 | Kordic |
| 2009/0250790 A1 | 10/2009 | Nakayama et al. |
| 2010/0105302 A1 | 4/2010 | Chen et al. |
| 2010/0112917 A1 | 5/2010 | Leighton et al. |
| 2010/0279440 A1 | 11/2010 | Nakayama et al. |
| 2012/0045970 A1 | 2/2012 | Li et al. |
| 2012/0058709 A1* | 3/2012 | Fukushima ........... B24B 37/015 451/5 |
| 2013/0026132 A1 | 1/2013 | Kato et al. |
| 2013/0210323 A1 | 8/2013 | Wu et al. |
| 2017/0313903 A1 | 11/2017 | Yamada et al. |

\* cited by examiner

PRIOR ART

CHEMICAL MECHANICAL POLISHING APPARATUS CONTAINING HYDRAULIC MULTI-CHAMBER BLADDER AND METHOD OF USING THEREOF

FIELD

The present disclosure is directed to chemical mechanical polishing systems and methods of chemical mechanical polishing.

BACKGROUND

As semiconductor devices have become more highly integrated in recent years, circuit interconnections have become finer and distances between those circuit interconnections have become smaller. For example, in photolithography, it is desirable that surfaces on which pattern images are to be focused by a stepper should be as flat as possible because the depth of focus of the optical system is relatively small. Chemical mechanical polishing (CMP) has been developed to planarize layers on semiconductor wafers for processes such as photolithography.

A typical chemical mechanical polishing apparatus comprises a polishing table having a polishing pad (polishing cloth) attached to an upper surface of the polishing table, and a top ring for holding a substrate to be polished, such as a semiconductor wafer. The polishing table and the top ring may be rotated at independent rotational speeds. The top ring presses the substrate against the polishing pad under a predetermined pressure. A polishing liquid (slurry) is supplied from a polishing liquid supply nozzle onto the polishing pad. In this manner, a surface of the substrate is polished to a flat mirror finish.

SUMMARY

An embodiment is drawn to a method of polishing a substrate including chemically mechanically polishing a substrate in a polishing apparatus having a bladder, measuring an eddy current in the substrate, determining a temperature of the substrate at a plurality of locations on the substrate and providing a temperature control liquid to the bladder to at least one of cool or heat and maintain the substrate at substantially the same temperature while polishing the substrate. At least one of a temperature or pressure of the cooling liquid is based at least in part on the measured eddy current.

Another embodiment is drawn to a method of polishing a substrate including chemically mechanically polishing the substrate in a polishing apparatus having a multi-chamber bladder, mixing relatively hotter and relatively colder liquids at different ratios and providing different ratios of the relatively hotter and relatively colder liquids to respective chambers of the multi-chamber bladder to cool different portions of the substrate at different rates to maintain the substrate at substantially the same temperature while polishing the substrate.

Another embodiment is drawn to a chemical mechanical polishing apparatus including a polishing wheel configured to support a polishing pad, a top ring that is configured to press the substrate against the polishing pad, a multi-chamber bladder configured to be filled with a liquid and located in the top ring and a liquid supply system configured to provide the hotter and colder cooling liquids to the multi-chamber bladder.

DETAILED DESCRIPTION

Figures 1A, 1B:
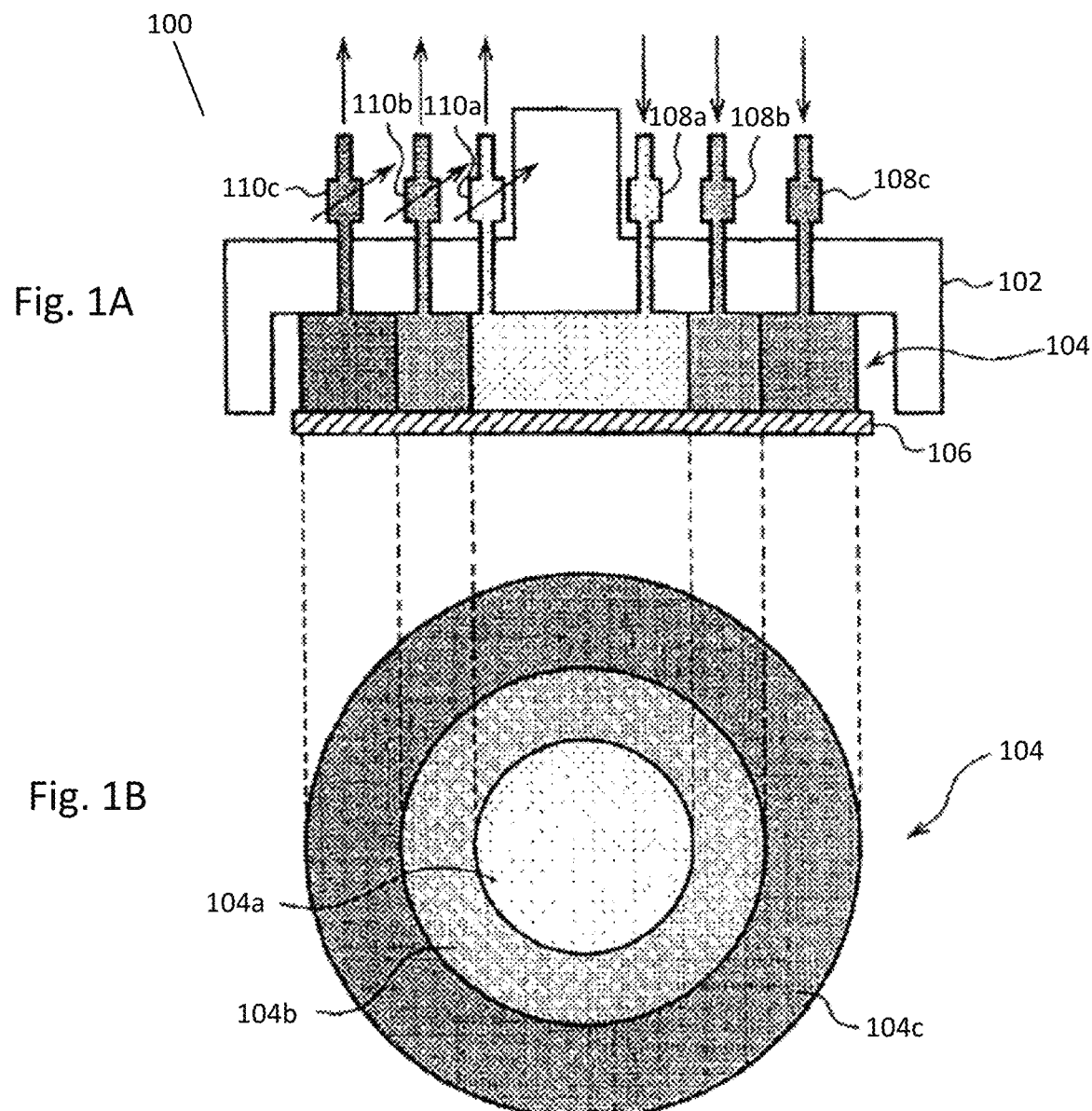
FIGS. 1A and 1B are schematic side cross sectional view of a substrate holding portion of a conventional chemical mechanical polishing apparatus.

FIGS. 1A and 1B illustrate the substrate holding portion 100 of a conventional chemical mechanical polishing apparatus described in U.S. Pat. No. 7,156,720. The substrate holding portion 100 includes a bag 104 located in a top ring 102. The semiconductor wafer 106 is located adjacent the bag 104 inside the top ring 102. Inflating the bag 104 causes the semiconductor wafer 106 to protrude beyond the top surface of the top ring 102, thereby allowing the exposed surface of the semiconductor wafer 106 to reach the polishing pad (not shown). In this manner, the semiconductor wafer 106 can be polished.

The bag 104 includes multiple concentric chambers 104a, 104b, 104c which can be independently inflated or deflated via inlets 108a, 108b, 108c and outlets 110a, 110b, 110c.

Figure 2:
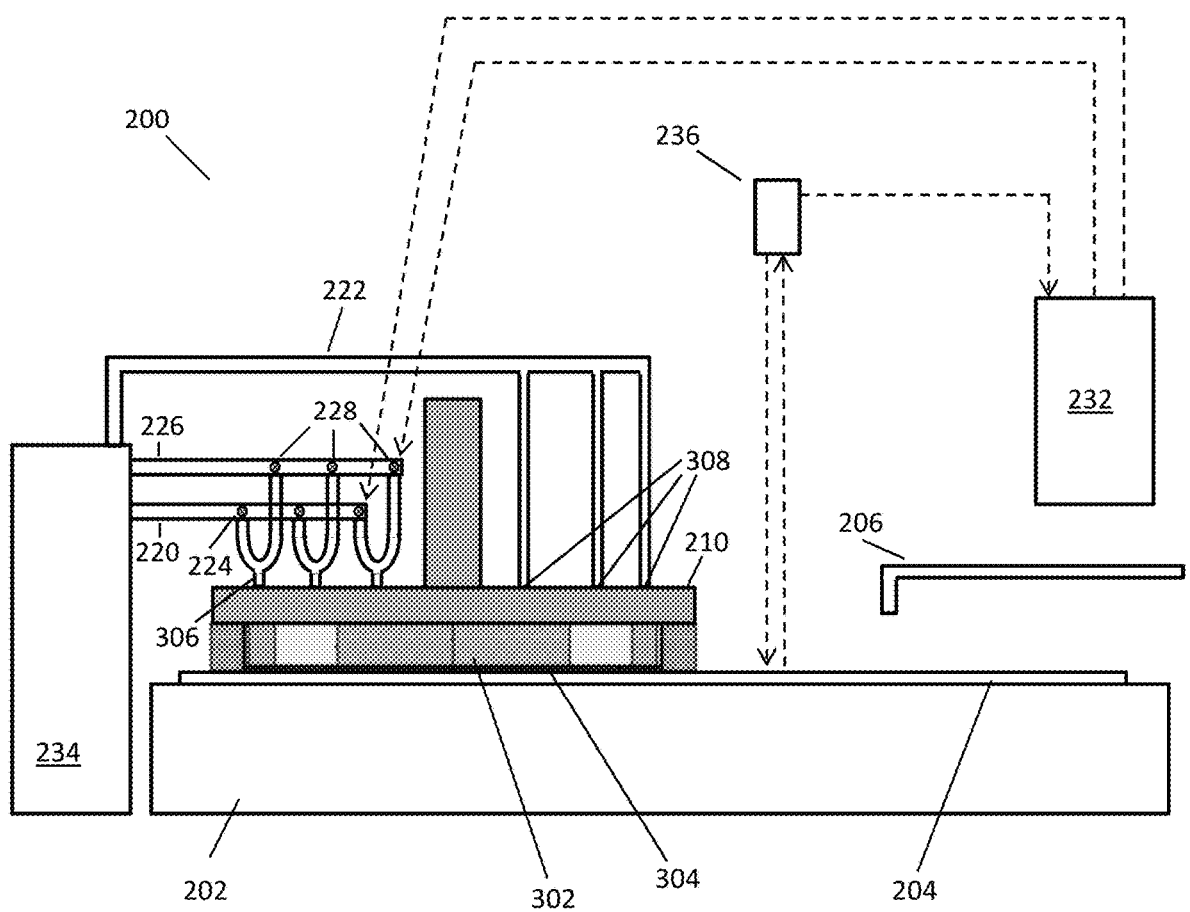
FIG. 2 is a schematic side cross sectional view of a chemical mechanical polishing apparatus according to an embodiment.

FIG. 2 illustrates a chemical mechanical polishing apparatus 200 according to an embodiment. In this embodiment, the chemical mechanical polishing apparatus 200 includes a polishing wheel (e.g., turntable) 202 having a polishing cloth/pad 204 thereon. The chemical mechanical polishing apparatus 200 also includes a slurry nozzle 206 through which an abrasive slurry may be supplied to the polishing cloth/pad 204.

The chemical mechanical polishing apparatus 200 also includes a top ring 210. As in the conventional chemical mechanical polishing apparatus discussed above, the top ring 210 holds the wafer 304. In an embodiment, the top ring 210 is configured to rotate independently of the turntable 202. The top ring 210 may be configured to rotate in the same direction or in the opposite direction as the turntable 202. The temperature of the polishing cloth/pad 204 may be monitored with a temperature sensor 236, such as an IR sensor. Temperature data from the temperature sensor 236 may be provided to a controller 232 such as personal computer or a dedicated controller, which controls the temperature and/or the flow rate of the cooling fluid into the multi-chamber bladder 302, which is described in more detail below.

In an embodiment, the multi-chamber bladder 302 is provided cold water from a hot/cooling water supply system 234 via a cold water conduit 220. The cold water may be provided to the multi-chamber bladder 302 from conduit 220 through the top ring 210. The flow of cold water provided to the multi-chamber bladder 302 may controlled with cold water valves 224. Further, the cold water may be returned to the hot/cooling water supply system 234 via a return conduit 222. The multi-chamber bladder 302 may be provided hot water from the hot/cooling water supply system 234 via a hot water conduit 226. The flow of hot water provided to the multi-chamber bladder 302 may controlled with hot water valves 228. As with the cold water, the hot water may be provided to the multi-chamber bladder 302 through conduit 226 through the top ring 210. The hot water may be returned to the hot/cooling water supply system 234 via the return conduit 222.

Figure 3:
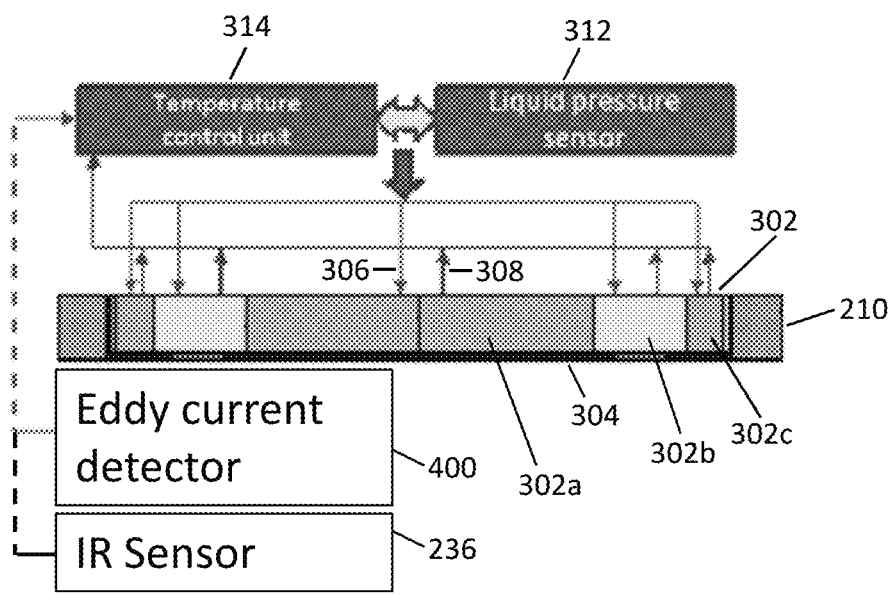
FIG. 3 is a schematic illustration of an embodiment of a multi-chamber bladder for a chemical mechanical apparatus.

As illustrated in FIG. 3, the chemical mechanical polishing apparatus 200 includes the multi-chamber bladder 302 containing separate chambers 302a, 302b, 302c configured to fit inside the top ring 210. The multi-chamber bladder 302 is advantageous over a bag with a single chamber because it allows the pressure and temperature on different regions of the wafer 304 to be independently controlled. Independent control of different regions of the wafer 304 is beneficial because of the large variation in linear velocity across the semiconductor wafer 304 for a given rotational velocity. The greater linear velocity at the outer edge of the semiconductor wafer 304 causes the generation of more heat due to friction during polishing of the wafer relative to the center of the wafer. The excess heat results in a temperature gradient across the wafer which can cause warping of the wafer which adversely affects the quality of the planarization. In the embodiment illustrated in FIG. 3, the multi-chamber bladder 302 is a unitary bladder with internal dividers to form the separate volumes which comprise the separate chambers 302a, 302b, 302c.

In an alternative embodiment, the multi-chamber bladder 302 includes individual bladder portions 302a, 302b, 302c located in separate parts or chambers of the top ring 210. The individual bladder portions 302a, 302b, 302c of the multi-chamber bladder 302 of the alternative embodiment form the separate chambers of the multi-chamber bladder. The individual bladder portions may or may not physically contact each other. The temperature and pressure of the individual bladder portions can be separately controlled by providing a different amount and/or temperature of the cooling liquid into each bladder portion, which therefore perform analogously to the separate chambers of the unitary bladder.

The multi-chamber bladder 302 can be inflated with a liquid to press the wafer 304 against the polishing cloth/pad 204. In an embodiment, each chamber of the multi-chamber bladder 302 includes at least one liquid inlet 306 and at least one liquid outlet 308 connected to the return conduit 222. The multi-chamber bladder 302 may be provided with hot and/or cold water via conduits connected to the hot/cooling water supply system 234. In an embodiment, a liquid other than water, such as oil or ethylene glycol, is provided to the chambers of the multi-chamber bladder 302.

In an embodiment, the temperature in the separate chambers 302a, 302b, 302c of the multi-chamber bladder 302 is controlled by adjusting the ratio of hot/cold water supplied to each of the separate chambers 302a, 302b, 302c via separate liquid inlets 306 which are connected to at least one inlet conduit 220 and/or 226 of the water supply system 234. Two or more of the separate chambers 302a, 302b, 302c may be controlled to have the same temperature. Alternatively, all of the chambers may have different temperatures.

A temperature control unit 314 (which may be part of the controller 232 or a separate controller) and a liquid pressure sensor 312 may be provided to separately monitor the liquid temperature and/or pressure in each chamber of the multi-chamber bladder 302 and the temperature of the wafer 304 under each chamber of the multi-chamber bladder 302. In an embodiment, the temperature and/or pressure of the liquid to each chamber of the multi-chamber bladder 302 can be separately controlled in response to detected wafer temperature and/or bladder chamber pressure.

In an embodiment, eddy current testing is conducted during polishing to monitor the quality of the polishing. Specifically, the eddy current testing can measure substrate polishing uniformity and rate, and measure a thickness of an electrically conductive layer, such as a metal, metal nitride or metal silicide layer in-situ during the polishing process, in addition to controlling pressure and temperature of the bladder 302 at the same time in the polishing process.

In the eddy current method, a current is induced in the electrically conductive layer on the wafer that is being polished in response to an alternating current which is flowed through a coil located adjacent to the wafer. Variations in the electrical conductivity and magnetic permeability of the electrically conductive layer on the wafer are detected by an eddy current detector 400. The electrical conductivity and magnetic permeability variations from the eddy current detector 400 and the signals from IR sensor 236 are provided to the controller 232 (e.g., to the temperature control unit 314 of the controller) to control the polishing process to reduce variation of final thickness of the electrically conductive layer and/or effect of initial electrically conductive layer thickness variation on the polishing process. The temperature of the temperature control fluid (e.g., mixture of hot and/or cold water) provided to the various chambers 302a, 302b and 302c for the bladder 302 may be controlled and varied based on the electrical conductivity and magnetic permeability variations for each radial zone of the wafer 304 detected by the eddy current detector 400.

Figure 4:
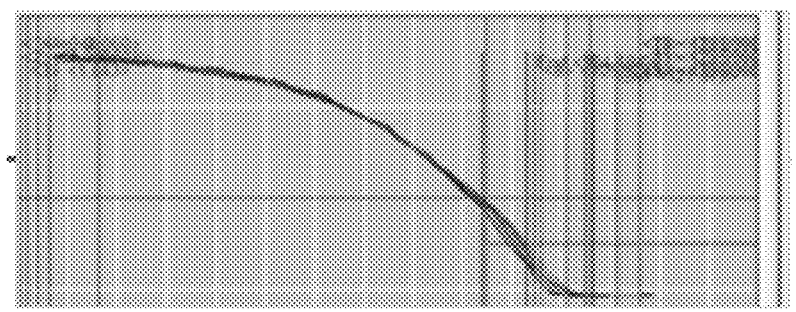
FIG. 4 is a plot of the eddy current measured in multiple locations in a wafer to monitor polishing conditions.

FIG. 4 is a plot which illustrates the eddy current measured in five zones on a wafer 304. In an embodiment, the eddy current curve in each zone of the wafer 304 in combination with signals from the IR sensor 236 are provided to the temperature control unit 314 to determine the temperature of the respective regions of the wafer 304, and then to control the temperature of the cooling fluid provided to each chamber of the bladder 302.

As described above, one embodiment of the present disclosure is directed to a method of polishing a substrate 304. The method includes chemically mechanically polishing the substrate 304 in a polishing apparatus 200 having a bladder 302. The method includes measuring an eddy current in the substrate 304 using the eddy current detector 400 and using the temperature control unit 314 to determine a temperature of the substrate 304 at a plurality of locations on the substrate. The method also includes providing a temperature control liquid to the bladder 302 to cool or heat and maintain the substrate 304 at substantially the same temperature while polishing the substrate. At least one of a temperature or pressure of the cooling liquid is based at least in part on the measured eddy current. Polishing uniformity is degraded by a gradient in temperature and change in the condition of the consumables (e.g. wear of the polishing cloth/pad 204, quantity of polishing slurry, etc.). Each chemical mechanical process has an optimum temperature based on consumables' composition (e.g. polishing cloth/pad 204, polishing slurry, etc.). In an embodiment, control of chemical mechanical polishing uniformity and/or polish rate is achieved with at least one of eddy current and IR sensor feedback. Feedback is used to control the chemical mechanical polishing process by controlling the temperature of the temperature control liquid and/or the pressure in the bladder 302 or in the chambers 302a, 302b and 302c of the multi-chamber bladder 302.

In one embodiment shown in FIG. 3, the bladder 302 comprises multi-chamber bladder having plural chambers 302a, 302b and 302c. A different amount or temperature of the temperature control liquid is provided to different chambers 302a, 302b and 302c of the multi-chamber bladder 302 via the inlets 306 from the water supply system 234 to cool different portions (e.g., different radial zones) of the substrate 304 at different rates. The chambers 302a, 302b and 302c of the multi-chamber bladder 302 can be arranged concentrically. The temperature of the substrate 304 can vary by less than 5° C., such as by less than 1° C., from portion to portion (i.e., between an inner radial zone and an outer radial zone), In one embodiment, the substrate 304 is a semiconductor wafer, such as a silicon wafer. The step of polishing the substrate can comprise polishing an electrically conductive layer located on the semiconductor wafer.

In one embodiment, the method further comprises providing the temperature control liquid from the water supply system 234 at a first temperature to a first chamber (e.g., 302a) of the multi-chamber bladder and providing the temperature control liquid at a different second temperature to a second chamber (e.g., 302c) of the multi-chamber bladder 302. Different mixtures of relatively hotter and relatively colder liquids can be provided from the water supply system 234 to different chambers of the multi-chamber bladder 302 based on measuring the eddy current using the eddy current detector 400. This cools or heats different portions of the substrate at different rates to maintain the substrate at substantially the same temperature while polishing the substrate 304. The method can further include measuring the temperature of the substrate (e.g., either directly or indirectly by measuring a temperature of the polishing pad 204) at several locations on the substrate using an infra-red sensor 236 and adjusting the temperature of the cooling liquid and adjusting at least one of a temperature or a flow rate of the cooling liquid based on the measurement.

In another embodiment, a method of polishing a substrate 304 includes chemically mechanically polishing the substrate in a polishing apparatus 200 having a multi-chamber bladder 302. The method also includes mixing relatively hotter and relatively colder liquids from the water supply system 234 at different ratios, and providing the different ratios of the relatively hotter and relatively colder liquids to respective chambers 302a to 302c of the multi-chamber bladder 302 to cool different portions (e.g., different radial zones) of the substrate 304 at different rates to maintain the substrate at substantially the same temperature while polishing the substrate. The mixing of the liquids can take place inside the respective chambers 302a to 302c of the multi-chamber bladder 302 if the hotter and colder liquids are provided to each chamber from separate inlets 306. Alternatively, the mixing of the liquids can take place upstream of the respective chambers 302a to 302c of the multi-chamber bladder 302 if the hotter and colder liquids are provided to each chamber from the same inlet 306.

In one embodiment, the method also includes determining the temperature of the substrate 304 at several locations on the substrate, determining the different ratios of the relatively hotter and relatively colder liquids based on the step of determining the temperature, and providing the determined different ratios of the relatively hotter and relatively colder liquids to different chambers 302a to 302c of the multi-chamber bladder 302 from the water supply system 234 using the inlets 306 and their associated conduits. In one embodiment, determining the temperature of the substrate comprises measuring infra-red radiation emanating from the polishing pad 204 and/or from the substrate 304 that is detected by the IR sensor 236.

An embodiment includes, a chemical mechanical polishing apparatus 200 including a polishing wheel 202 configured to support a polishing pad 204, a top ring 210 that is configured to press the substrate 304 against the polishing pad 204, a multi-chamber bladder 302 configured to be filled with a liquid and located in the top ring 210 and a liquid supply system 234 configured to provide the hotter and colder temperature control liquids to the bladder. In an embodiment, the apparatus further comprises at least one first conduit 220 or 226 which connects the liquid supply system 234 to the multi-chamber bladder 302. In an embodiment, the at least one first conduit 220 or 226 comprises plural conduits connected to different chambers 302a, 302b, 302c of the multi-chamber bladder 302 to provide different ratios of the relatively hotter and relatively colder liquids to respective chambers of the multi-chamber bladder 302.

In one embodiment, while chemically mechanically polishing the substrate 304 in the apparatus 200, a ratio of the relatively hotter and relatively colder liquids provided to the multi-chamber bladder 302 is changed by the controller 232 in response to a change in detected temperature of the substrate 304. The temperature of the substrate can be detected by the IR sensor 236 and/or determined indirectly from eddy current measured by the eddy current detector 400.

The embodiments of the disclosure provide high uniformity control and process variation reduction for chemical mechanical polishing. The embodiment apparatus contains a liquid filled bladder instead of an air filled bag which presses the wafer from the backside. This bladder can independently control temperature of each radial zone of the wafer from the backside of the wafer.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of polishing a substrate, comprising:
chemically mechanically polishing a substrate in a polishing apparatus having a multi-chamber bladder including a plurality of chambers with a respective set of a cold liquid valve and a warm liquid valve, wherein each of the cold liquid valves is connected to a common cold liquid supply system configured to provide a cold liquid at a first temperature, and each of the warm liquid valves is connected to a common warm liquid supply system configured to provide a warm liquid at a second temperature that is higher than the first temperature, wherein each set of the cold liquid valve and the warm liquid valve is configured to provide a respective temperature control liquid obtained by mixing the cold liquid and the warm liquid at a respective mixing ratio for a respective one of the plurality of chambers;
determining a temperature of the substrate at a plurality of locations on the substrate, thereby generating multiple measured values for the temperature of the substrate at the multiple locations of the substrate; and
providing the respective temperature control liquid for each of the plurality of chambers of the multi-chamber bladder to cool the substrate at different cooling rates, thereby maintaining the substrate at substantially the same temperature while polishing the substrate, wherein the mixing ratio for each temperature control liquid for a respective one of the chambers is determined based at least in part on the multiple measured values for the temperature of the substrate at the multiple locations of the substrate.

2. The method of claim 1, wherein:
the plurality of chambers of the multi-chamber bladder is arranged concentrically;
the temperature of the substrate varies by less than 5° C. from portion to portion; and
polishing the substrate comprises polishing an electrically conductive layer located on a semiconductor wafer.

3. The method of claim 1, wherein at least two temperature control liquids among a set of all temperature control liquids for the plurality of chambers have different temperatures.

4. The method of claim 1, wherein each of the cool liquid and the warm liquid comprises water, ethylene glycol or oil.

5. The method of claim 1, further comprising independently adjusting a flow rate of each of the temperature control liquids.

6. The method of claim 5, further comprising:
using an infra-red sensor to measure a temperature of a polishing pad to determine the temperature of the substrate at the plurality of locations on the substrate;
measuring an eddy current in the substrate while polishing an electrically conductive layer located on the substrate; and
controlling at least one of a uniformity and a polish rate of the polishing based on at least one of eddy current and infra-red sensor feedback by controlling the temperatures of each of the temperature control liquids.

7. The method of claim 6, wherein the at least one of the uniformity and the polish rate of the polishing is controlled by controlling a pressure of a respective temperature control liquid within a respective one of the plurality of chambers.

8. The method of claim 1, wherein at least two temperature control liquids among a set of all temperature control liquids for the plurality of chambers have different mixing ratios.

9. The method of claim 8, wherein each mixing ratio for a respective one of the temperature control liquids is determined based on a respective one of the multiple measured values for the temperature of the substrate at the multiple locations of the substrate.

10. A method of polishing a substrate, comprising:
chemically mechanically polishing the substrate in a polishing apparatus having a multi-chamber bladder;
mixing relatively hotter and relatively colder liquids at different ratios; and
providing different ratios of the relatively hotter and relatively colder liquids to respective chambers of the multi-chamber bladder to cool different portions of the substrate at different rates to maintain the substrate at substantially the same temperature while polishing the substrate.

11. The method of claim 10, wherein the chambers of the multi-chamber bladder are arranged concentrically.

12. The method of claim 10, wherein the temperature of the substrate varies by less than 5° C. from portion to portion.

13. The method of claim 10, further comprising determining the temperature of the substrate at several locations on the substrate, determining the different ratios of the relatively hotter and relatively colder liquids based on the step of determining the temperature, and providing the determined different ratios of the hotter and relatively colder liquids to different chambers of the multi-chamber bladder.

14. The method of claim 13, wherein determining the temperature of the substrate comprises using an infra-red sensor to measure a temperature of a polishing pad.

15. The method of claim 14, wherein polishing the substrate comprises polishing an electrically conductive layer located on a semiconductor wafer while measuring an eddy current in the substrate.

16. The method of claim 8, wherein:
the plurality of chambers cools different portion of the substrate at different rates due to different temperatures among the temperature control liquids caused by differences in the mixing ratios.

* * * * *